US008862963B2

(12) United States Patent
Nakanishi et al.

(10) Patent No.: US 8,862,963 B2
(45) Date of Patent: Oct. 14, 2014

(54) NONVOLATILE MEMORY, MEMORY CONTROLLER, NONVOLATILE MEMORY ACCESSING METHOD, AND PROGRAM

(75) Inventors: Kenichi Nakanishi, Tokyo (JP); Keiichi Tsutsui, Kanagawa (JP)

(73) Assignee: Sony Corporation, Tokyo (JP)

( * ) Notice: Subject to any disclaimer, the term of this patent is extended or adjusted under 35 U.S.C. 154(b) by 224 days.

(21) Appl. No.: 13/474,280

(22) Filed: May 17, 2012

(65) Prior Publication Data

US 2012/0311408 A1    Dec. 6, 2012

(30) Foreign Application Priority Data

Jun. 3, 2011    (JP) ................. 2011-125079

(51) Int. Cl.
*G11C 29/00* (2006.01)
*H03M 13/00* (2006.01)
*G06F 13/28* (2006.01)
*G06F 13/00* (2006.01)
*G06F 11/10* (2006.01)
*G06F 13/42* (2006.01)
*G06F 13/16* (2006.01)
*G06F 15/80* (2006.01)
*G06F 9/38* (2006.01)
*G06F 11/14* (2006.01)

(52) U.S. Cl.
CPC ........ *G06F 11/1048* (2013.01); *G06F 13/4269* (2013.01); *G06F 13/1673* (2013.01); *G06F 11/1008* (2013.01); *G06F 13/4252* (2013.01); *G06F 15/8061* (2013.01); *G06F 9/3871* (2013.01); *G06F 13/161* (2013.01); *G06F 11/1068* (2013.01); *G06F 13/16* (2013.01); *G06F 11/141* (2013.01); *H03M 13/6566* (2013.01); *G06F 11/1004* (2013.01); *G06F 13/4286* (2013.01)
USPC ........... 714/763; 714/768; 714/773; 714/774; 711/167; 710/33; 710/36; 710/40

(58) Field of Classification Search
CPC ....... G06F 13/161; G06F 13/16; G06F 13/42; G06F 13/1673; G06F 13/4286; G06F 13/4252; G06F 13/4269; G06F 11/16; G06F 11/141; G06F 11/1048; G06F 11/1004; G06F 11/1008; G06F 11/1068; G06F 15/8061; G06F 2213/16; G06F 2212/1024; G06F 2213/0064; G06F 9/3871; G11C 2207/2272; H03M 13/6566
USPC ........ 714/763, 768, 773, 774; 710/33, 36, 40; 711/167
See application file for complete search history.

(56) References Cited

U.S. PATENT DOCUMENTS 7,299,399 B2 * 11/2007 Huang .......................... 714/757
7,404,057 B2 *  7/2008 Radhakrishnan et al. .... 711/167

(Continued)

FOREIGN PATENT DOCUMENTS

JP       2007-310927      11/2007
JP       2008-084499       4/2008
WO   WO 2009021176 A9 *   5/2009

OTHER PUBLICATIONS

Bourgade et al., Accurate analysis of memory latencies for WCET estimation, Nov. 4, 2008, 16th International Conference on Real-Time and Network Systems (RTNS 2008), pp. 1-10.*

*Primary Examiner* — John J Tabone, Jr.
(74) *Attorney, Agent, or Firm* — Sony Corporation

(57) ABSTRACT

Disclosed herein is a nonvolatile memory including: a nonvolatile memory cell device including at least a nonvolatile memory cell array accessible in units of a word and further accessible at least with a fixed latency in a first access mode and with a variable latency in a second access mode; a first access path used in the first access mode; a second access path used in the second access mode; a first ECC processing part configured to be connected to the first access path and to perform error detection and correction using an ECC on the data output from the nonvolatile memory cell array in the first access mode; and a second ECC processing part configured to be connected to the second access path and to perform error detection and correction using the ECC on the data output from the nonvolatile memory cell array in the second access mode.

20 Claims, 7 Drawing Sheets

(56) References Cited

U.S. PATENT DOCUMENTS

| | | | |
|---|---|---|---|
| 7,571,297 B2 * | 8/2009 | Gould et al. | 711/167 |
| 7,581,127 B2 * | 8/2009 | Rajan et al. | 713/320 |
| 7,590,796 B2 * | 9/2009 | Rajan et al. | 711/103 |
| 7,624,209 B1 * | 11/2009 | Ansari et al. | 710/58 |
| 7,929,356 B2 * | 4/2011 | De Caro et al. | 365/189.05 |
| 8,181,094 B2 * | 5/2012 | Lastras-Montano et al. | 714/776 |
| 8,208,315 B2 * | 6/2012 | De Caro et al. | 365/189.05 |
| 8,291,126 B2 * | 10/2012 | Zitlaw | 710/5 |
| 8,341,311 B1 * | 12/2012 | Szewerenko et al. | 710/22 |
| 8,352,806 B2 * | 1/2013 | Gollub et al. | 714/54 |
| 8,438,453 B2 * | 5/2013 | Post et al. | 714/763 |
| 8,589,655 B2 * | 11/2013 | Colgrove et al. | 711/167 |
| 2003/0217238 A1 * | 11/2003 | Rowlands et al. | 711/154 |
| 2004/0098549 A1 * | 5/2004 | Dorst | 711/167 |
| 2006/0026375 A1 * | 2/2006 | Christenson et al. | 711/167 |
| 2007/0005922 A1 * | 1/2007 | Swaminathan et al. | 711/167 |
| 2008/0028135 A1 * | 1/2008 | Rajan et al. | 711/106 |
| 2008/0256416 A1 * | 10/2008 | Ozawa | 714/758 |
| 2009/0282308 A1 * | 11/2009 | Gutsche et al. | 714/746 |
| 2009/0327535 A1 * | 12/2009 | Liu | 710/52 |
| 2012/0084507 A1 * | 4/2012 | Colgrove et al. | 711/114 |
| 2013/0024745 A1 * | 1/2013 | Sharon et al. | 714/763 |
| 2013/0282991 A1 * | 10/2013 | Ruberg et al. | 711/149 |

\* cited by examiner

FIRST INTERFACE (FIXED CYCLE)

SECOND INTERFACE
(HANDSHAKE WITH xBsy, VARIABLE CYCLE)

NONVOLATILE MEMORY, MEMORY CONTROLLER, NONVOLATILE MEMORY ACCESSING METHOD, AND PROGRAM

BACKGROUND

The present disclosure relates to a nonvolatile memory accessible in units of a word, a memory controller, a nonvolatile memory accessing method, and a program.

Advances in the miniaturization of process technology for the NAND flash device representative of nonvolatile memories (NVM) have been known to reduce the data retention characteristics of the device. In view of that disadvantage, there has been a need for an error correction code (ECC) capable of providing the device with better error detection and correction than before.

Improved data retention is also one of the key challenges facing the PCRAM (Phase Change Random Access Memory (RAM)) and ReRAM (Resistance RAM), new nonvolatile memories of which the development and commercialization have been advancing in recent years.

Unlike the NAND flash device, the PCRAM and ReRAM can be accessed in units of a word just like the DRAM and SRAM. For that capability, the PCRAM and ReRAM are called NVRAMs (Non Volatile RAM).

The NAND flash device is accessed sequentially at high speed for continuous data. By contrast, the NVRAM is a nonvolatile memory that supports high-speed random access not provided by the NAND flash device.

The NAND flash device is generally used as a storage part in store-and-download (SnD) model applications in which data is read in units of a sector into a work memory for execution.

By contrast, the NVRAM accessible in units of a word allows data therein to be accessed directly by the CPU. For this reason, the NVRAM can be used as a nonvolatile work memory in execute-in-place (XIP) model applications.

To support XIP involves making the most of the primary feature of the NVRAM: its accessibility in units of a word. However, adding an ECC feature to the NVRAM to improve its data retention characteristics as mentioned above can lower access performance of the memory.

Japanese Patent Laid-open No. 2008-84499 (called Patent Document 1 hereunder) discloses a nonvolatile memory furnished with a NAND flash device and configured to improve random access performance.

The NAND flash device-based nonvolatile memory calculates ECC in units of a sector. That means the memory needs to have its data read out in units of at least a sector for error detection and correction purposes. This has lead to the disadvantage of random access being implemented at lower speeds in units of a data size smaller than the sector.

Patent Document 1 proposes performing ECC on data of 32 to 128 bits for error detection and correction in order to improve random access performance with the data smaller in size than the sector.

That is, Patent Document 1 proposes a technique aimed at the NAND flash device of which the memory cells are accessed in units of a page, the technique being used to carry out ECC processing on the data smaller in size than the access unit.

SUMMARY

As mentioned above, to support XIP involves making the most of the capability of the NVRAM to permit access to the data therein in units of a word. However, adding the above-described ECC feature to improve the data retention characteristics of the NVRAM generally requires satisfying the following two conditions:

It is desired that the latency of access be fixed. It is also desired that the effects of ECC processing on access latency be limited to a minimum.

In meeting the first condition above, a handshake protocol of the memory interface may be omitted for access with a fixed latency to achieve high speeds. Polling the handshake signal and having the result of the polling determined and reflected on signal control can contribute to increasing the number of access cycles.

In meeting the second condition above, the clock speed necessary for ECC processing is simply desired to be lower. Where a bit error correction process takes place, the number of access cycles needs to be increased to cover the process. This aspect is also relevant to the first condition.

Upon sequential access, by contrast, if access with a fixed access time is repeated a plurality of times, the overhead of performance stemming from the fixed access time is accumulated. This can lead to a degradation of the original performance.

It is also problematic to support both XIP and sequential access.

Where the NAND flash device is targeted, data needs to be written there in units of a page as mentioned above. For this reason, performance is not expected to improve through the use of the technique disclosed in Patent Document 1.

A similar technique is disclosed in Japanese Patent Laid-open No. 2007-310927 (called Patent Document 2 hereunder). However, it is also difficult to improve performance using the technique described in Patent Document 2.

The present disclosure has been made in view of the above circumstances and provides a nonvolatile memory made of memory cells accessible in units of a byte and permitting ECC processing in units of an optimal data size when accessed, a memory controller, a nonvolatile memory accessing method, and a program.

According to one embodiment of the present disclosure, there is provided a nonvolatile memory including: a nonvolatile memory cell device configured to include at least a nonvolatile memory cell array accessible in units of a word and further accessible at least with a fixed latency in a first access mode and with a variable latency in a second access mode; a first access path configured to be used in the first access mode; a second access path configured to be used in the second access mode; a first ECC processing part configured to be connected to the first access path and to perform error detection and correction using an error correction code (ECC) on the data output from the nonvolatile memory cell array in the first access mode; and a second ECC processing part configured to be connected to the second access path and to perform error detection and correction using the ECC on the data output from the nonvolatile memory cell array in the second access mode.

According to another embodiment of the present disclosure, there is provided a nonvolatile memory including: a nonvolatile memory cell array configured to be accessible in units of a word and further accessible at least with a fixed latency in a first access mode and with a variable latency in a second access mode; a first access path configured to be used in the first access mode; a second access path configured to be used in the second access mode; and a first ECC processing part configured to be connected to the first access path, to perform error detection and correction using an error correction code (ECC) on the data output from the nonvolatile memory cell array in the first access mode, and to generate and add a first ECC to the data to be written to the nonvolatile memory cell array.

According to a further embodiment of the present disclosure, there is provided a memory controller at least including: a host interface configured to interface with a host device; a memory interface configured to interface with a nonvolatile memory cell array accessible in units of a word; a first access path configured to be connected interposingly between the host interface and the memory interface and to be used in a first access mode permitting access with a fixed latency; a second access path configured to be connected interposingly between the host interface and the memory interface and to be used in a second access mode permitting access with a variable latency; and a second ECC processing part configured to be connected to the second access path, to perform error detection and correction using an error correction code (ECC) on the data output from the nonvolatile memory cell array and input through the memory interface in the second access mode, and to add a second ECC to the data to be written after being input through the host interface, before outputting the data to the memory interface. In the memory controller, the data output from the nonvolatile memory cell array and subjected to first ECC processing before being input through the memory interface in the first access mode, and the data to be written after being input through the host interface in the first access mode, are transmitted over the first access path.

According to an even further embodiment of the present disclosure, there is provided a nonvolatile memory accessing method including: upon access to a nonvolatile memory cell array accessible in units of a word, accessing the nonvolatile memory cell array via a first access path in a first access mode permitting access with a fixed latency; and accessing the nonvolatile memory cell array via a second access path in a second access mode permitting access with a variable latency. In the nonvolatile memory, the access to the nonvolatile memory cell array via the first access path in the first access mode includes causing a first ECC processing part connected to the first access path to perform error detection and correction using an error correction code (ECC) on the data output from the nonvolatile memory cell array in the first access mode and to generate and add a first ECC to the data to be written to the nonvolatile memory cell array, and the access to the nonvolatile memory cell array via the second access path in the second access mode includes causing a second ECC processing part connected to the second access path to perform error detection and correction using the ECC on the data output from the nonvolatile memory cell array in the second access mode and to generate and add a second ECC to the data to be written to the nonvolatile memory cell array.

According to a still further embodiment of the present disclosure, there is provided a program for causing a computer to execute a nonvolatile memory access process including: upon access to a nonvolatile memory cell array accessible in units of a word, accessing the nonvolatile memory cell array via a first access path in a first access mode permitting access with a fixed latency; and accessing the nonvolatile memory cell array via a second access path in a second access mode permitting access with a variable latency. In the program, the access to the nonvolatile memory cell array via the first access path in the first access mode includes causing a first ECC processing part connected to the first access path to perform error detection and correction using an error correction code (ECC) on the data output from the nonvolatile memory cell array in the first access mode and to generate and add a first ECC to the data to be written to the nonvolatile memory cell array, and the access to the nonvolatile memory cell array via the second access path in the second access mode includes causing a second ECC processing part connected to the second access path to perform error detection and correction using the ECC on the data output from the nonvolatile memory cell array in the second access mode and to generate and add a second ECC to the data to be written to the nonvolatile memory cell array.

According to the present disclosure embodied as outlined above, it is possible to permit access to memory cells in units of a byte and to perform ECC processing on the memory cells in units of an optimal data size when they are accessed.

BRIEF DESCRIPTION OF THE DRAWINGS

Further features and advantages of the present disclosure will become apparent upon a reading of the following description and appended drawings in which.

DETAILED DESCRIPTION OF THE PREFERRED EMBODIMENTS

Some preferred embodiments of the present disclosure will now be described below in reference to the accompanying drawings. The description will be given under the following headings:

1. First embodiment (first configuration example of the nonvolatile memory);
2. Second embodiment (second configuration example of the nonvolatile memory);
3. Third embodiment (third configuration example of the nonvolatile memory), and
4. Fourth embodiment (fourth configuration example of the nonvolatile memory).

1. First Embodiment

Figure 1:
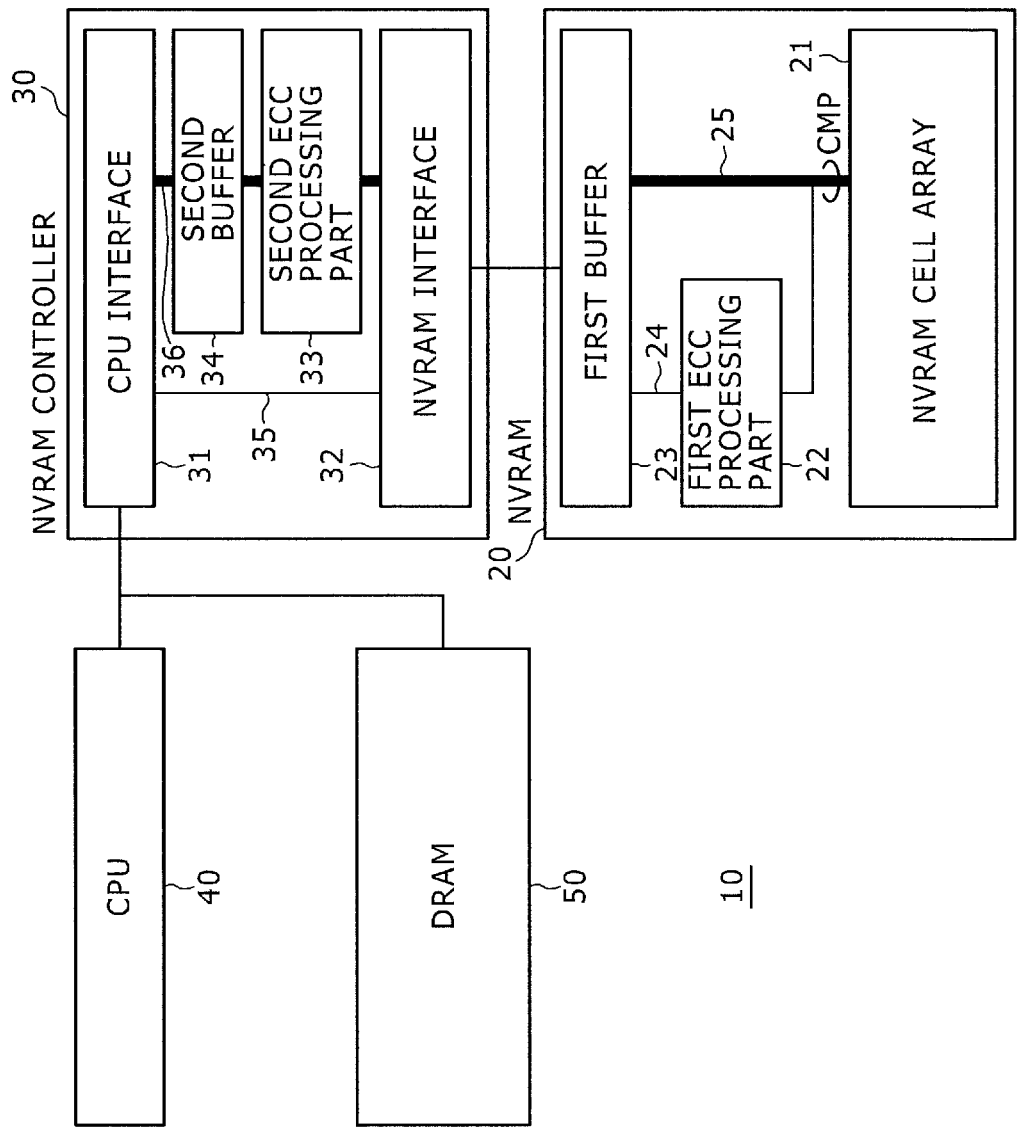
FIG. 1 is a schematic view showing a configuration of a nonvolatile memory as one embodiment of the present disclosure.

FIG. 1 is a schematic view showing a configuration of a nonvolatile memory 10 as a first embodiment of the present disclosure.

The nonvolatile memory 10 practiced as the first embodiment of this disclosure has an NVRAM 20 as a nonvolatile memory (NVM) cell device including an NVRAM cell array randomly accessible in units of a word, and an NVRAM controller 30 acting as a memory controller.

The nonvolatile memory 10 is configured to include a host device (CPU) 40 that can access the NVRAM 20 via the NVRAM controller 30, and a DRAM 50 serving as a work memory directly accessible from the host device 40.

[Characteristic Structures and Functions of this Embodiment]

The nonvolatile memory 10 of this embodiment is characterized to provide, for access to a nonvolatile storage area of the NVRAM 20, a first access mode permitting XIP-ready ECC processing and a second access mode allowing sequential ECC processing.

The first access mode is an access mode optimized in terms of performance overhead during XIP-ready operations, for example. As such, the first access mode permits access with a fixed latency.

The second access mode is an access mode optimized in terms of sequential access overhead. The access latency is varied in the second access mode.

The nonvolatile memory 10 of this embodiment selectively uses either of these two access modes for access to its nonvolatile storage area. This feature enables the nonvolatile memory 10 to improve its operating efficiency as a memory system.

The first access mode is used by the CPU 40 for direct access to the storage area in units of a word in XIP use cases. This mode permits ECC processing in units of a data size small enough to be optimal for XIP applications. Bit error detection and correction is carried out in this mode.

Furthermore, the first access mode is designed to be complete in a fixed access time. In the first access mode, data with or without a bit error is thus processed in a fixed time that includes the time for bit error correction. In this embodiment, handshake processing to be carried out in the interface is omitted so as to shorten the access cycle.

In the second access mode, ECC processing is performed in units of a larger data size than in the first access mode in sequential access use cases. It follows that the second access mode permits access at higher speeds than the first access mode that would have to be repeated to achieve the same result.

Also, since data is handled in the second access mode in units of a larger data size than in the first access mode, the larger the number of bit errors detected, the longer the time is to correct these errors in the second access mode. Thus the second access mode is used in conjunction with an interface that involves handshake processing for optimizing the access time.

[Structures and Functions of the NVRAM and Memory Controller]

The NVRAM 20 has an NVRAM cell array 21, a first ECC processing part 22, a first buffer 23, a first access path 24 for use in the first access mode, and a second access path 25 for use in the second access mode.

The first access path 24 is used in the first access mode permitting access with a fixed latency. The second access path 25 is used in the second access mode allowing access with a variable latency.

In FIG. 1, the input and output to and from the NVRAM cell array 21 are shown as a common access path CMP.

The NVRAM cell array 21 has nonvolatile memory cells arrayed therein and is formed as a nonvolatile random access memory accessible in units of a word (i.e., in bytes) via an NVRAM interface 32.

The NVRAM cell array 21 can be accessed from the host device (CPU) 40 via the NVRAM controller 30 in the first access mode permitting access with a fixed latency or in the second access mode allowing access with a variable latency.

The first ECC processing part 22 is connected to the first access path 24 and performs error detection and correction using an error correction code (ECC) on the data output (i.e., read) from the NVRAM cell array 21 in the first access mode. The first ECC processing part 22 outputs the data having undergone ECC processing to the first buffer 23.

The first ECC processing part 22 generates and adds a first ECC to the data transferred from the NVRAM controller 30 in the first access mode and held in the first buffer 23 before being written to the NVRAM cell array 21. The first ECC processing part 22 outputs the write data together with the first ECC to the NVRAM cell array 21 via the first access path 24.

The first buffer 23 is connected to the first access path 24 and second access path 25. Specifically, the first buffer 23 is coupled to the first access path 24 and second access path 25 on the side of the interface through which data is exchanged with the NVRAM controller 30.

The first buffer 23 holds the data read from the NVRAM cell array 21 and transmitted over the first access path 24 before being processed by the first ECC processing part 22, and the data read from the NVRAM cell array 21 and transmitted over the second access path 25.

The first buffer 23 also holds the data transmitted over a first access path of the external NVRAM controller 30 before being written to the NVRAM cell array 21.

The first buffer 23 also holds the data transmitted over the second access path of the NVRAM controller 30 and subjected to second ECC processing before being written to the NVRAM cell array 21.

The NVRAM controller 30 has a CPU (host) interface 31 for interfacing with the host device (CPU) 40 and a memory (NVRAM) interface 32 for interfacing with the NVRAM 20.

The NVRAM controller 30 also has a second ECC processing part 33, a second buffer 34, a first access path 35, and a second access path 36.

The first access path 35 and the second access path 36 are positioned in parallel between the CPU interface 31 and the NVRAM interface 32.

The first access path 35 is used in the first access mode permitting access with a fixed latency. The second access path 36 is used in the second access mode allowing access with a variable latency.

The second ECC processing part 33 is connected to the second access path 36, and performs error detection and correction using the ECC on the data output from the NVRAM cell array 21 in the second access mode and input via the NVRAM interface 32. The second ECC processing part 33 outputs the data having undergone the ECC processing to the second buffer 34.

The second ECC processing part 33 adds a second ECC to the write data transferred from the CPU 40 in the second access mode and input via the CPU interface 31, and outputs the data together with the second ECC to the NVRAM interface 32 via the second access path 36.

The second buffer 34 is connected to (i.e., located on) the second access path 36 between the CPU interface 31 and the second ECC processing part 33.

The second buffer 34 holds the data read from the NVRAM cell array 21, transmitted over the second access path 25, held in the first buffer 23, input via the NVRAM interface 32, and processed by the second ECC processing part 33.

The second buffer 34 also holds the data input via the CPU interface 31 and transmitted over the second access path 36 before being written to the NVRAM cell array 21.

In the first embodiment, the following data is transmitted over the first access path 35:

In the first access mode, what is transmitted over the first access path 35 is the data output from the NVRAM cell array 21, subjected to first ECC processing in the first ECC processing part 22, held in the first buffer 23, and input via the NVRAM interface 32.

The write data input via the CPU interface 31 in the first access mode is also transmitted over the first access path 35.

Figure 2:
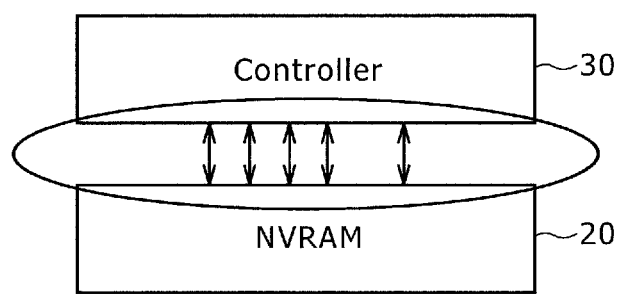
FIG. 2 is a schematic view explanatory of an interface between a memory controller and an NVRAM.

FIG. 2 is a schematic view explanatory of an interface between the NVRAM controller 30 and the NVRAM 20.

Figure 3A:
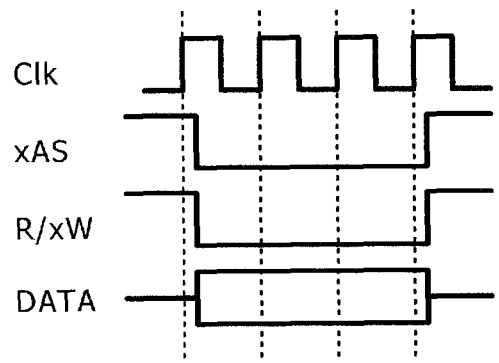
FIGS. 3A and 3B are timing charts of a first interface and a second interface, FIG. 3A showing how the first interface handles fixed cycles using typical control signals and data without recourse to a handshake signal, FIG. 3B showing how the second interface handles variable cycles using typical control signals and data and by having recourse to a handshake signal.
Figure 3B:
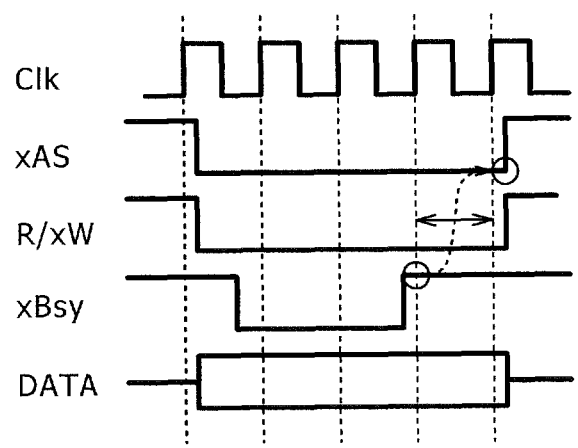

FIG. 3A is a timing chart showing how the first interface handles fixed cycles using typical control signals and data without recourse to a handshake signal. FIG. 3B is a timing chart showing how the second interface handles variable cycles using typical control signals and data and by having recourse to a handshake signal.

As described above, the interface for accessing the NVRAM 20 can be controlled using a handshake signal for monitoring data exchanges as shown in FIG. 2.

According to the technology of the present disclosure, in the first access mode, control based on the handshake signal is not performed as shown in FIG. 3A. In the second access mode, control is performed using the handshake signal, i.e., a busy signal xBsy in the example of FIG. 3B.

Figure 4:
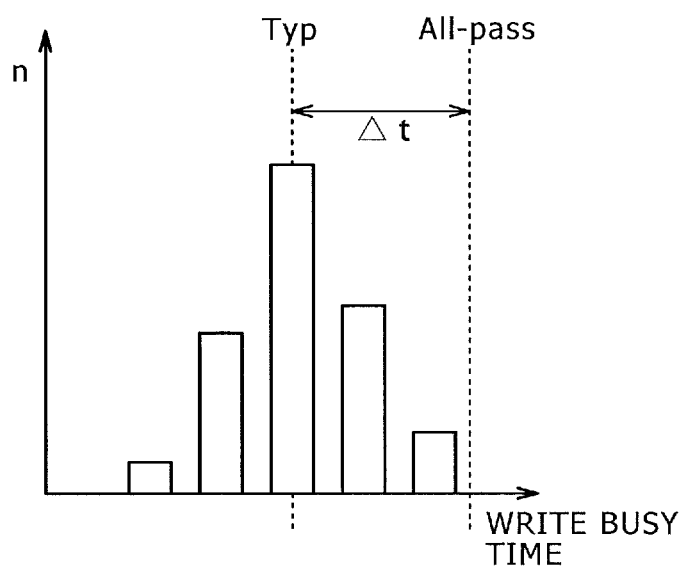
FIG. 4 is a graphic representation explanatory of a write time distribution.

FIG. 4 is a graphic representation explanatory of a write time distribution.

Generally, the busy time required to write data to nonvolatile memory cells (i.e., the time required to repeat the program-to-verify iteration) has a certain distribution.

In FIG. 4, the horizontal axis represents write busy time and the vertical axis denotes the number of memory cells.

To operate in a fixed cycle usually requires at least an all-pass time. Regarding the cells to which data can be written in a time Typ, Δt indicated in FIG. 4 represents overhead.

If a sequential access pass is performed by repeating a fixed cycle, the overhead is added to the time it takes to accomplish the pass. Thus sequential access should preferably be carried out using a variable cycle.

In the first access mode, the read access latency as a fixed time includes the time to read data from the NVRAM cell array 21, the time for the first ECC processing part 22 to detect any bit error, and the time for the first ECC processing part 22 to correct the bit error.

Also in the first access mode, the write access latency includes the time to generate a first ECC and the time to write data to the NVRAM cell array 21.

In the second access mode, the read access latency as a variable time includes, as a minimum, the time to read data from the NVRAM cell array 21 and the time for the second ECC processing part 33 to detect any bit error.

Also in the second access mode, the variable-time read access latency includes, as a maximum, the time to read data from the NVRAM cell array 21, the time for the second ECC processing part 33 to detect any bit error, and the time for the second ECC processing part 33 to correct the bit error.

In the second access mode, the write access latency includes the time to generate a second ECC and the time to write data to the NVRAM cell array 21.

The components configured as discussed above operate as follows:

In the configuration of FIG. 1, the NVRAM 20 contains the first ECC processing part 22 and the first buffer 23, both connected to the first access path 24 intended for processing in the first access mode.

In the NVRAM 20, the first ECC processing part 22 directly performs error detection and correction on the data output from the NVRAM cell array 21. The data having undergone the error detection and correction is held in the first buffer 23.

The CPU 40 can access the data in the first buffer 23 in units of a byte or a word with a fixed latency via the NVRAM controller 30.

The NVRAM controller 30 contains the second ECC processing part 33 and the second buffer 34, both connected to the second access path 36 and intended for processing in the second access mode.

In the NVRAM controller 30, the second ECC processing part 33 performs error detection and correction on the data read via the NVRAM interface 32. The data having undergone the error detection and correction is held in the second buffer 34.

The NVRAM controller 30 controls the handshake signal upon access from the CPU 40 in the second access mode.

Also, the NVRAM controller 30 outputs the busy signal xBsy when the NVRAM 20 is accessed and the data read therefrom is transferred to the NVRAM controller 30, until the data is processed by the second ECC processing part 33 and placed into the second buffer 34.

The first access mode is a mode in which the NVRAM 20 is directly accessed by the CPU 40 for program execution or for retrieval of specific data needed for the execution. The data handled in this mode is protected using the first ECC for improved data reliability.

The first ECC processing part 22 processes data of which the size is that of the first buffer 23. At write time, the first ECC processing part 22 generates and adds the first ECC to the write data before storing the data into the NVRAM cell array 21.

The NVRAM cell array 21 is thus accessed in units of the first buffer size. The data stored in this manner in the first buffer 23 can be accessed in units of a byte or a word via the NVRAM interface 32.

The NVRAM interface 32 has a fixed access cycle. The NVRAM interface 32 thus has no need for handshake signal control upon access to the first buffer 23.

The size of the first buffer 23 should preferably coincide with the cache entry size inside the CPU 40. Generally, the first buffer size may be 32 bytes or 64 bytes, for example.

The second access mode is a mode in which sequential access is performed efficiently, as when the CPU 40 accesses a large amount of data or when data is transferred from storage. The data handled in this mode is protected using the second ECC for improved data reliability.

The second ECC processing part 33 processes data of which the size is that of the second buffer 34. At write time, the second ECC processing part 33 generates and adds the second ECC to the write data before storing the data into the NVRAM cell array 21.

Thus the size of the second buffer 34 should preferably be an integer multiple of the size of the first buffer 23. In this case, the first buffer size includes the size of the area in which to store the first ECC.

Second ECC processing is carried out by the second ECC processing part 33 in the NVRAM controller 30. Consequently, the data to be read into the second buffer 34 is retrieved via the NVRAM interface 32 with the first buffer 23 accessed a plurality of times.

At this point, the first ECC effective in the first access mode is invalidated. All data including that of the area for storing the first ECC is read from the memory cells of the NVRAM 20 into the first buffer 23. From the first buffer 23, the data is output via the NVRAM interface 32.

The data output from the NVRAM 20 is input to the second ECC processing part 33 in the NVRAM controller 30. After undergoing the bit error detection and correction inside the second ECC processing part 33, the data is eventually written to the second buffer 34.

After issuing necessary instructions to the NVRAM controller 30 in the second access mode for access to the data in the second buffer 34, the CPU 40 needs to wait for all processes to be completed. For that reason, the CPU 30 monitors the handshake signal (busy signal xBsy) found in the interface of the NVRAM controller 30.

The size of the second buffer 34 should preferably coincide with the page size of a virtual memory system. Generally, the second buffer size may be 2048 bytes or 4096 bytes, for example.

As explained above, the first embodiment of the disclosure permits memory cells to be accessed in units of a byte and allows ECC processing to be performed on the accessed data in units of an optimal size.

In an NVRAM subjected to ECC for improved data reliability, it is possible to use selectively the area permitting high-speed random access or the area offering high-speed sequential access. The first embodiment thus helps implement a high-speed nonvolatile memory.

2. Second Embodiment

Figure 5:
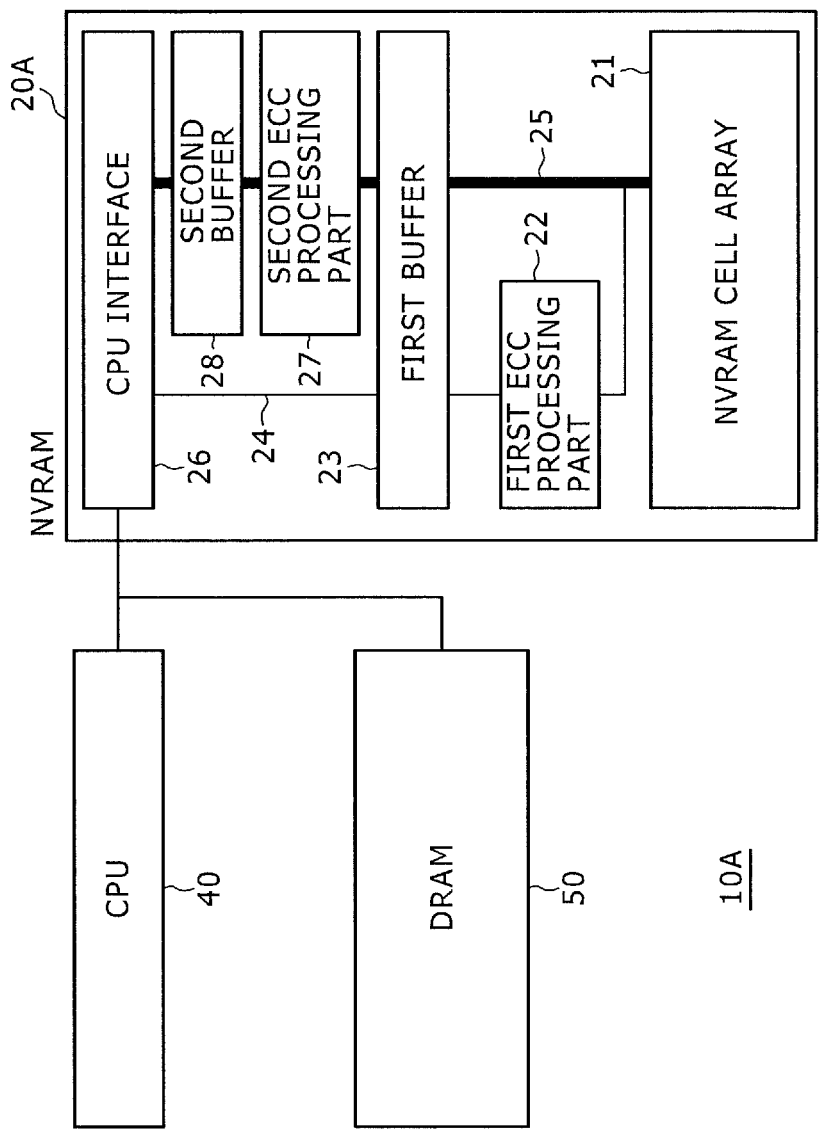
FIG. 5 is a schematic view showing a configuration of a nonvolatile memory as another embodiment of the present disclosure.

FIG. 5 is a schematic view showing a configuration of a nonvolatile memory 10A as a second embodiment of the present disclosure.

The major differences between the nonvolatile memory 10A of the second embodiment and the nonvolatile memory 10 of the first embodiment are as follows:

The nonvolatile memory 10A is arranged to have its NVRAM 20A furnished with the functionality of an NVRAM controller.

In conjunction with this feature, the NVRAM 20A includes a CPU interface 26, as well as a second ECC processing part 27 and a second buffer 28 which are needed in the second access mode.

An NVRAM interface, not shown, does not use a handshake signal in the first access mode and controls the handshake signal in the second access mode.

The structures and functions of the second ECC processing part 27 and second buffer 28 are substantially the same as those of the second ECC processing part 33 and second buffer 34 shown in FIG. 1.

The second ECC processing part 27 and the second buffer 28 are connected to the second access path 25 between the CPU interface 26 and the first buffer 23.

The second embodiment thus provides substantially the same effects as the above-described first embodiment.

3. Third Embodiment

Figure 6:
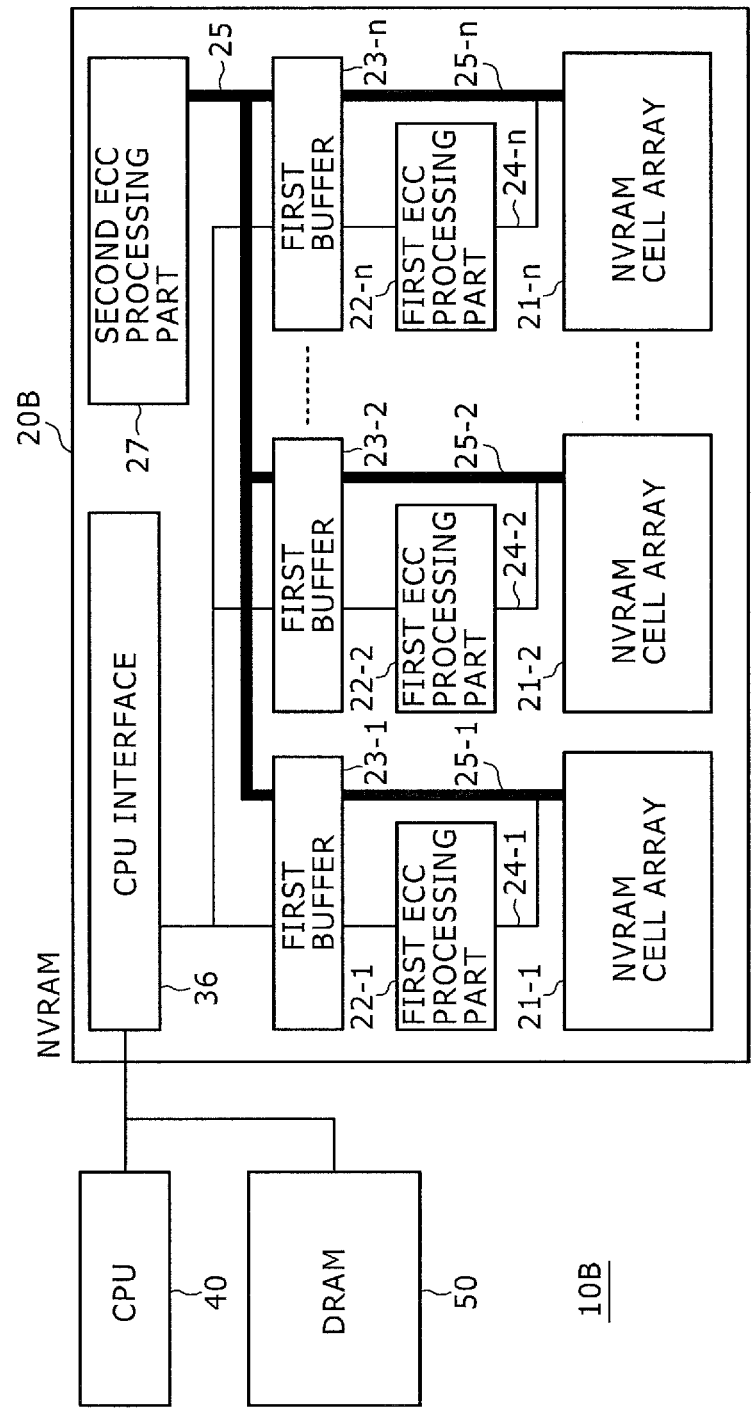
FIG. 6 is a schematic view showing a configuration of a nonvolatile memory as a further embodiment of the present disclosure.

FIG. 6 is a schematic view showing a configuration of a nonvolatile memory 10B as a third embodiment of the present disclosure.

The major differences between the nonvolatile memory 10B of the third embodiment and the nonvolatile memory 10A of the second embodiment are as follows:

The nonvolatile memory 10B has an NVRAM 20B that includes a plurality (n) of NVRAM cell arrays 21, a plurality (n) of first ECC processing parts 22, a plurality (n) of first buffers 23, a plurality (n) of first access paths 24, and a plurality (n) of second access paths 25.

The first and the second buffers are used on a shared basis. The plurality of first buffers 23-1 through 23-n also have the second buffer capability.

In the third embodiment, the plurality of NVRAM cell arrays 21-1 through 21-n connected to the first buffers 23-1 through 23-n are controlled simultaneously and parallelly.

The NVRAM interface does not use a handshake signal in the first access mode, and controls the handshake signal in the second access mode.

4. Fourth Embodiment

Figure 7:
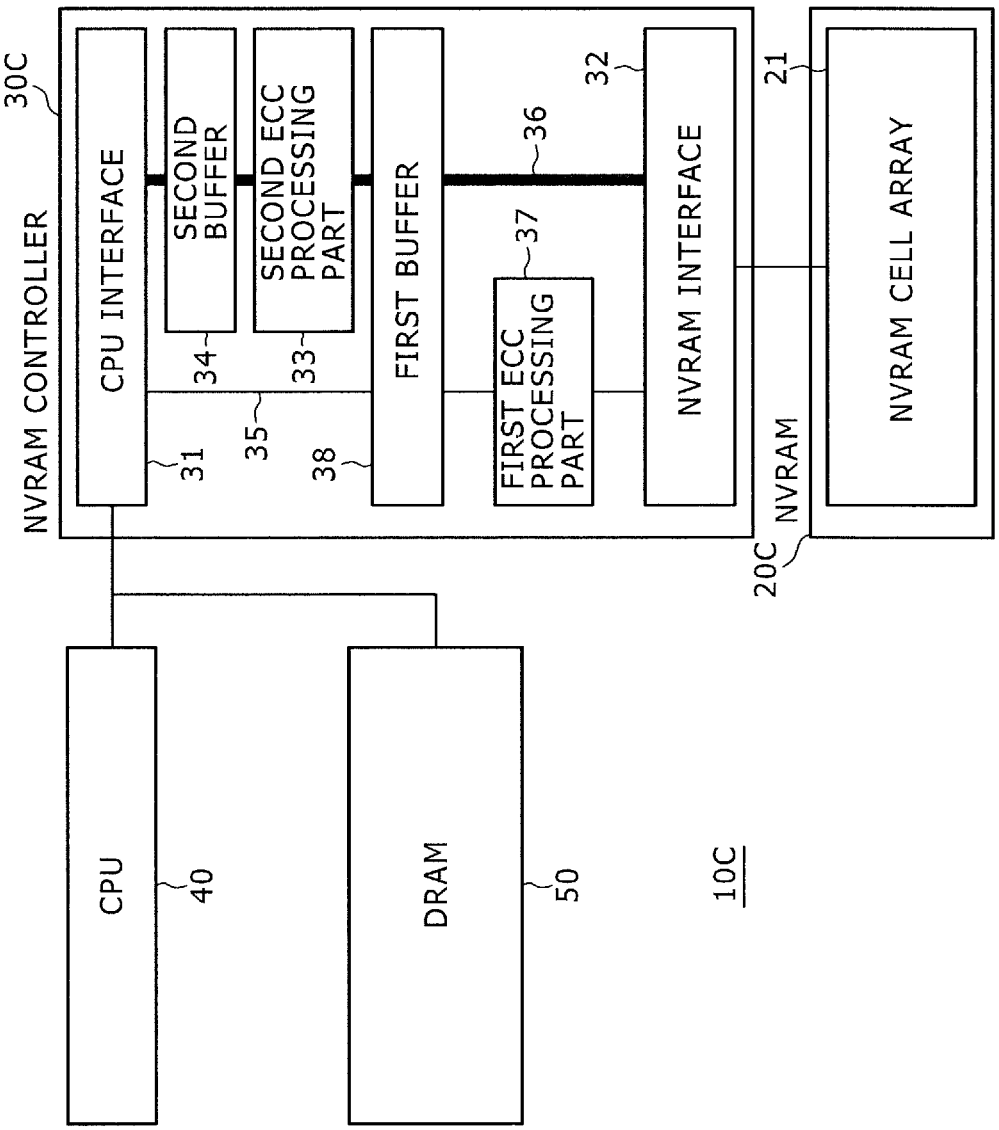
FIG. 7 is a schematic view showing a configuration of a nonvolatile memory as an even further embodiment of the present disclosure.

FIG. 7 is a schematic view showing a configuration of a nonvolatile memory 10C as a fourth embodiment of the present disclosure.

The major differences between the nonvolatile memory 10C of the fourth embodiment and the nonvolatile memory 10 of the first embodiment are as follows:

The nonvolatile memory 10C has an NVRAM 20C that contains only the NVRAM cell array 21, and an NVRAM controller 30C that includes a first ECC processing part 37 and a first buffer 38.

The structures and functions of the first ECC processing part 37 and first buffer 38 are substantially the same as those of the first ECC processing part 22 and first buffer 23 shown in FIG. 1.

The first ECC processing part 37 is connected to the first access path 35. In the first access mode, the first ECC processing part 37 performs error detection and correction using the ECC on the data output from the NVRAM cell array 21 and input via the NVRAM interface 32.

The first ECC processing part 37 adds the first ECC to the write data input via the CPU interface 31 before outputting the data together with the first ECC to the NVRAM interface 32.

The first buffer 38 is connected to the first access path 35 between the CPU interface 31 and the first ECC processing part 37 and to the second access path 36 between the NVRAM interface 32 and the second ECC processing part 33.

The fourth embodiment thus provides substantially the same effects as the above-described first embodiment.

The method explained above in detail can also be implemented as a program reflecting the above-described procedure so that the program can be executed by a computer or like equipment including a CPU.

The above-mentioned program can be stored on an appropriate recording medium such as a semiconductor memory, a magnetic disk, an optical disk, or a floppy disk (registered trademark) so that the program can be executed by the computer or the like to which the recording medium carrying the program is being attached.

The technology of the present disclosure may also be configured as follows:

(1) A nonvolatile memory including:
a nonvolatile memory cell device configured to include at least a nonvolatile memory cell array accessible in units of a word and further accessible at least with a fixed latency in a first access mode and with a variable latency in a second access mode;
a first access path configured to be used in the first access mode;
a second access path configured to be used in the second access mode;
a first ECC processing part configured to be connected to the first access path and to perform error detection and correction using an error correction code known as an ECC on the data output from the nonvolatile memory cell array in the first access mode; and a second ECC processing part configured to be connected to the second access path and to perform error detection and correction using the ECC on the data output from the nonvolatile memory cell array in the second access mode.

(2) The nonvolatile memory according to paragraph (1), wherein, in the first access mode, the access latency at a fixed read time includes the time to read data from the nonvolatile memory cell array, the time for the first ECC processing part to detect a bit error, and the time for the first ECC processing part to correct the bit error.

(3) The nonvolatile memory according to paragraph (1) or (2), wherein, in the first access mode, the first ECC processing part generates and adds a first ECC to data at write time, and the access latency at write time includes the time to generate the first ECC and the time to write data to the nonvolatile memory cell array.

(4) The nonvolatile memory according to any one of paragraphs (1) to (3), wherein, in the second access mode, the access latency at a variable read time includes the time to read data from the nonvolatile memory cell array and the time for the second ECC processing part to detect a bit error as a minimum; and the time to read data from the nonvolatile memory cell array, the time for the second ECC processing part to detect a bit error, and the time for the second ECC processing part to correct the bit error as a maximum.

(5) The nonvolatile memory according to any one of paragraphs (1) to (4), wherein, in the second access mode, the second ECC processing part generates and adds a second ECC to data at write time, and the access latency at write time includes the time to generate the second ECC and the time to write data to the nonvolatile memory cell array.

(6) The nonvolatile memory according to any one of paragraphs (1) to (5), further including an interface configured to permit access to the nonvolatile memory cell device, the interface being controllable using a handshake signal for monitoring data exchanges, the interface not being controlled using the handshake signal in the first access mode, the interface being further controlled using the handshake signal in the second access mode.

(7) The nonvolatile memory according to any one of paragraphs (1) to (6), further including:

a first buffer configured to be connected to the first access path and the second access path; and a second buffer configured to be connected to the second access path, wherein the first buffer holds at least the data read from the nonvolatile memory cell array and transmitted over the first access path before being processed by the first ECC processing part, the data read from the nonvolatile memory cell array and transmitted over the second access path, the data transmitted over the first access path before being written to the nonvolatile memory cell array, or the data transmitted over the second access path and through the second buffer and the second ECC processing part before being written to the nonvolatile memory cell array, and the second buffer holds at least the data read from the nonvolatile memory cell array and transmitted over the second access path before being held in the first buffer and processed by the second ECC processing part, or the data transmitted over the second access path before being written to the nonvolatile memory cell array.

(8) The nonvolatile memory according to paragraph (7), wherein the first buffer and the second buffer are used on a shared basis, the first buffer additionally offering the functionality of the second buffer.

(9) The nonvolatile memory according to paragraph (7), further including a memory controller configured to include a host interface for interfacing with a host device and a memory interface for interfacing with the nonvolatile memory cell array, the memory controller controlling access to the nonvolatile memory cell device, wherein the memory controller includes the first access path, the second access path, the second ECC processing part connected to the second access path, and the second buffer connected to the second access path, and the nonvolatile memory cell device includes the nonvolatile memory cell array, the first access path, the second access path, the first ECC processing part connected to the first access path, and the first buffer connected to the first access path and the second access path.

(10) The nonvolatile memory according to paragraph (7) or (8), further including a host interface configured to interface with a host device, wherein the nonvolatile memory cell device includes the nonvolatile memory cell array, the host interface, the first access path, the second access path, the first ECC processing part connected to the first access path, the first buffer connected to the first access path and the second access path, and the second ECC processing part and the second buffer connected to the second access path.

(11) A nonvolatile memory including:

a nonvolatile memory cell array configured to be accessible in units of a word and further accessible at least with a fixed latency in a first access mode and with a variable latency in a second access mode;

a first access path configured to be used in the first access mode;

a second access path configured to be used in the second access mode; and a first ECC processing part configured to be connected to the first access path, to perform error detection and correction using an error correction code known as an ECC on the data output from the nonvolatile memory cell array in the first access mode, and to generate and add a first ECC to the data to be written to the nonvolatile memory cell array.

(12) The nonvolatile memory according to paragraph (11), further including a first buffer configured to be connected to the first access path and the second access path, wherein the first buffer holds at least the data read from the nonvolatile memory cell array and transmitted over the first access path before being processed by the first ECC processing part, the data read from the nonvolatile memory cell array and transmitted over the second access path, the data transmitted over an external first access path before being written to the nonvolatile memory cell array, or input data transmitted over an external second access path and subjected to second ECC processing before being written to the nonvolatile memory cell array.

(13) A memory controller at least including:

a host interface configured to interface with a host device;

a memory interface configured to interface with a nonvolatile memory cell array accessible in units of a word;

a first access path configured to be connected interposingly between the host interface and the memory interface and to be used in a first access mode permitting access with a fixed latency;

a second access path configured to be connected interposingly between the host interface and the memory interface and to be used in a second access mode permitting access with a variable latency; and a second ECC processing part configured to be connected to the second access path, to perform error detection and correction using an error correction code known as an ECC on the data output from the nonvolatile memory cell array and input through the memory interface in the second access mode, and to add a second ECC to the data to be written after being input through the host interface, before outputting the data to the memory interface, wherein the data output from the nonvolatile memory cell array and subjected to first ECC processing before being input through the memory interface in the first access mode, and the data to be written after being input through the host interface in the first access mode, are transmitted over the first access path.

(14) The memory controller according to paragraph (13), further including a first ECC processing part configured to be connected to the first access path, to perform error detection and correction using an error correction code known as an ECC on the data output from the nonvolatile memory cell array and input through the memory interface in the second access mode, and to add a first ECC to the data to be written after being input through the host interface, before outputting the data to the memory interface.

(15) The memory controller according to paragraph (14), further including a second buffer connected interposingly between the host interface and the second ECC processing part.

(16) The memory controller according to paragraph (14), further including:

a first buffer configured to be connected to the first access path between the host interface and the first ECC processing part and to the second access path between the memory interface and the second ECC processing part; and a second buffer configured to be connected to the second access path between the host interface and the second ECC processing part.

(17) A nonvolatile memory accessing method including:

upon access to a nonvolatile memory cell array accessible in units of a word, accessing the nonvolatile memory cell array via a first access path in a first access mode permitting access with a fixed latency; and accessing the nonvolatile memory cell array via a second access path in a second access mode permitting access with a variable latency, wherein the access to the nonvolatile memory cell array via the first access path in the first access mode includes causing a first ECC processing part connected to the first access path to perform error detection and correction using an error correction code known as an ECC on the data output from the nonvolatile memory cell array in the first access mode and to generate and add a first ECC to the data to be written to the nonvolatile memory cell array, and the access to the nonvolatile memory cell array via the second access path in the second access mode includes causing a second ECC processing part connected to the second access path to perform error detection and correction using the ECC on the data output from the nonvolatile memory cell array in the second access mode and to generate and add a second ECC to the data to be written to the nonvolatile memory cell array.

(18) A program for causing a computer to execute a nonvolatile memory access process including:

upon access to a nonvolatile memory cell array accessible in units of a word, accessing the nonvolatile memory cell array via a first access path in a first access mode permitting access with a fixed latency; and accessing the nonvolatile memory cell array via a second access path in a second access mode permitting access with a variable latency, wherein the access to the nonvolatile memory cell array via the first access path in the first access mode includes causing a first ECC processing part connected to the first access path to perform error detection and correction using an error correction code known as an ECC on the data output from the nonvolatile memory cell array in the first access mode and to generate and add a first ECC to the data to be written to the nonvolatile memory cell array, and the access to the nonvolatile memory cell array via the second access path in the second access mode includes causing a second ECC processing part connected to the second access path to perform error detection and correction using the ECC on the data output from the nonvolatile memory cell array in the second access mode and to generate and add a second ECC to the data to be written to the nonvolatile memory cell array.

The present disclosure contains subject matter related to that disclosed in Japanese Priority Patent Application JP 2011-125079 filed in the Japan Patent Office on Jun. 3, 2011, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A nonvolatile memory comprising:
a nonvolatile memory cell device configured to include at least a nonvolatile memory cell array accessible in units of a word, wherein the nonvolatile memory cell array is accessible at least with a fixed latency in a first access mode and with a variable latency in a second access mode;
a first access path configured to be used to access the nonvolatile memory cell array in said first access mode, wherein the first access path comprises:
a first error correction code (ECC) processing part for performing error detection and correction using an ECC on a first data output from said nonvolatile memory cell array in said first access mode; and
a second access path configured to be used to access the nonvolatile memory cell array in said second access mode, wherein the second access path comprises:
a second ECC processing part for performing error detection and correction using the ECC on a second data output from said nonvolatile memory cell array in said second access mode.

2. The nonvolatile memory according to claim 1, wherein, in said first access mode,
an access latency at a fixed read time includes a time to read the first output data from said nonvolatile memory cell array, a time for said first ECC processing part to detect a bit error, and a time for said first ECC processing part to correct the bit error.

3. The nonvolatile memory according to claim 1, wherein, in said first access mode, said first ECC processing part generates and adds a first ECC to a first input data at a first write time, and an access latency at the first write time includes a time to generate said first ECC and a time to write the first input data to said nonvolatile memory cell array.

4. The nonvolatile memory according to claim 1, wherein, in said second access mode, an access latency at a variable read time includes a minimum read time and a maximum read time, wherein the minimum read time comprises a time to read the second data output from said nonvolatile memory cell array and a time for said second ECC processing part to detect a bit error; and the maximum read time comprises the time to read the second data output from said nonvolatile memory cell array, the time for said second ECC processing part to detect a bit error, and a time for said second ECC processing part to correct the bit error.

5. The nonvolatile memory according to claim 1, wherein, in said second access mode, said second ECC processing part generates and adds a second ECC to a second input data at a second write time, and an access latency at the second write time includes a time to generate said second ECC and a time to write the second input data to said nonvolatile memory cell array.

6. The nonvolatile memory according to claim 1, further comprising an interface configured to permit access to said nonvolatile memory cell device, said interface being controllable using a handshake signal for monitoring data exchanges, said interface not being controlled using said handshake signal in said first access mode, said interface being further controlled using said handshake signal in said second access mode.

7. The nonvolatile memory according to claim 1, further comprising:

a first buffer configured to be connected to said first access path and said second access path; and a second buffer configured to be connected to said second access path, wherein said first buffer holds at least the first data output from said nonvolatile memory cell array and transmitted over said first access path before being processed by said first ECC processing part, the second data output from said nonvolatile memory cell array and transmitted over said second access path, a first input data transmitted over said first access path before being written to said nonvolatile memory cell array, or a second input data transmitted over said second access path and through said second buffer and said second ECC processing part before being written to said nonvolatile memory cell array, and said second buffer holds at least the second data output from said nonvolatile memory cell array and transmitted over said second access path before being held in said first buffer and processed by said second ECC processing part, or the second input data transmitted over said second access path before being written to said nonvolatile memory cell array.

8. The nonvolatile memory according to claim 7, wherein said first buffer and said second buffer are used on a shared basis, said first buffer further holds at least the second data output or the second input data.

9. The nonvolatile memory according to claim 7, further comprising a memory controller configured to include a host interface for interfacing with a host device, and a memory interface for interfacing with said nonvolatile memory cell array, wherein said memory controller controls access to said nonvolatile memory cell device, wherein said memory controller includes said first access path, said second access path, said second ECC processing part connected to said second access path, and said second buffer connected to said second access path, and said nonvolatile memory cell device includes said nonvolatile memory cell array, said first access path, said second access path, said first ECC processing part connected to said first access path, and said first buffer connected to said first access path and said second access path.

10. The nonvolatile memory according to claim 7, further comprising a host interface configured to interface with a host device, wherein said nonvolatile memory cell device includes said nonvolatile memory cell array, said host interface, said first access path, said second access path, said first ECC processing part connected to said first access path, said first buffer connected to said first access path and said second access path, said second ECC processing part, and said second buffer connected to said second access path.

11. The nonvolatile memory according to claim 1, wherein the first access path is used in said first access mode for accessing the nonvolatile memory cell array for a random access, and the second access path is used in said second access mode for accessing the nonvolatile memory cell array for a sequential access.

12. A nonvolatile memory comprising:

a nonvolatile memory cell array configured to be accessible in units of a word and further accessible at least with a fixed latency in a first access mode and with a variable latency in a second access mode;

a first access path configured to be used to access the nonvolatile memory cell array in said first access mode;

a second access path configured to be used to access the nonvolatile memory cell array in said second access mode; and a first error correction code (ECC) processing part configured to be connected to said first access path, to perform error detection and correction using an ECC on a first data output from said nonvolatile memory cell array in said first access mode, and to generate and add a first ECC to a first input data to be written to said nonvolatile memory cell array.

13. The nonvolatile memory according to claim 12, further comprising a first buffer configured to be connected to said first access path and said second access path, wherein said first buffer holds at least the first data output from said nonvolatile memory cell array and transmitted over said first access path before being processed by said first ECC processing part, a second data output from said nonvolatile memory cell array and transmitted over said second access path, the first input data transmitted over the first access path before being written to said nonvolatile memory cell array, or a second input data transmitted over the second access path and subjected to second ECC processing before being written to said nonvolatile memory cell array.

14. A memory controller at least comprising:

a host interface configured to interface with a host device;

a memory interface configured to interface with a nonvolatile memory cell array accessible in units of a word;

a first access path configured to be connected interposingly between said host interface and said memory interface, and to be used for accessing the nonvolatile memory cell array in a first access mode permitting access with a fixed latency;

a second access path configured to be connected interposingly between said host interface and said memory interface, and to be used for accessing the nonvolatile memory cell array in a second access mode permitting access with a variable latency; and a second error correction code (ECC) processing part configured to be connected to said second access path, to perform error detection and correction using an ECC on a second data output from said nonvolatile memory cell array, and on a second input data through said memory interface in said second access mode, and to add a second ECC to the second input data to be written after being input through said host interface, before outputting the second input data to said memory interface, wherein a first data output from said nonvolatile memory cell array and subjected to first ECC processing before being input through said memory interface in said first access mode, and a first input data to be written after being input through said host interface in said first access mode, are transmitted over said first access path.

15. The memory controller according to claim 14, further comprising a second buffer connected interposingly between said host interface and said second ECC processing part.

16. The memory controller according to claim 14, further comprising a first ECC processing part configured to be connected to said first access path, to perform error detection and correction using the ECC on the first data output from said nonvolatile memory cell array and on the first input data through said memory interface in said first access mode, and to add a first ECC to the first input data to be written after being input through said host interface, before outputting the first input data to said memory interface.

17. The memory controller according to claim 16, further comprising:

a first buffer configured to be connected to said first access path between said host interface and said first ECC processing part, the first buffer further configured to be connected to said second access path between said memory interface and said second ECC processing part; and a second buffer configured to be connected to said second access path between said host interface and said second ECC processing part.

18. A nonvolatile memory accessing method comprising:
upon access to a nonvolatile memory cell array accessible in units of a word, accessing said nonvolatile memory cell array via a first access path in a first access mode, wherein the first access mode permits access of said nonvolatile memory cell array with a fixed latency; and accessing said nonvolatile memory cell array via a second access path in a second access mode, wherein the second access mode permits access of said nonvolatile memory cell array with a variable latency, wherein the access to said nonvolatile memory cell array via said first access path in said first access mode comprises causing a first error correction code (ECC) processing part connected to said first access path, to perform error detection and correction using an ECC on a first data output from said nonvolatile memory cell array in said first access mode, and to generate and add a first ECC to a first input data to be written to said nonvolatile memory cell array, and the access to said nonvolatile memory cell array via said second access path in said second access mode comprises causing a second ECC processing part connected to said second access path, to perform error detection and correction using the ECC on a second data output from said nonvolatile memory cell array in said second access mode, and to generate and add a second ECC to a second input data to be written to said nonvolatile memory cell array.

19. The nonvolatile memory accessing method according to claim 18, further comprising selectively accessing the nonvolatile memory cell array for a random access or a sequential access, wherein for the random access of the nonvolatile memory cell array, the first access path is used in said first access mode, and for the sequential access of the nonvolatile memory cell array, the second access path is used in said second access mode.

20. A non-transitory computer readable storage medium having stored thereon, a computer program, the computer program when executed by a computer causes the computer to perform steps comprising:

upon access to a nonvolatile memory cell array accessible in units of a word, accessing said nonvolatile memory cell array via a first access path in a first access mode, wherein the first access mode permits access of said nonvolatile memory cell array with a fixed latency; and accessing said nonvolatile memory cell array via a second access path in a second access mode, wherein the second access mode permits access of said nonvolatile memory cell array with a variable latency, wherein the access to said nonvolatile memory cell array via said first access path in said first access mode comprises causing a first error correction code (ECC) processing part connected to said first access path, to perform error detection and correction using an ECC on a first data output from said nonvolatile memory cell array in said first access mode, and to generate and add a first ECC to a first input data to be written to said nonvolatile memory cell array, and the access to said nonvolatile memory cell array via said second access path in said second access mode includes causing a second ECC processing part connected to said second access path, to perform error detection and correction using the ECC on a second data output from said nonvolatile memory cell array in said second access mode, and to generate and add a second ECC to a second input data to be written to said nonvolatile memory cell array.

* * * * *